(12) United States Patent
Rumer et al.

(10) Patent No.: US 7,358,606 B2
(45) Date of Patent: Apr. 15, 2008

(54) APPARATUS TO COMPENSATE FOR STRESS BETWEEN HEAT SPREADER AND THERMAL INTERFACE MATERIAL

(75) Inventors: Christopher L. Rumer, Chandler, AZ (US); Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 480 days.

(21) Appl. No.: 10/857,303

(22) Filed: May 28, 2004

(65) Prior Publication Data

US 2004/0217467 A1 Nov. 4, 2004

Related U.S. Application Data

(62) Division of application No. 09/963,438, filed on Sep. 27, 2001, now Pat. No. 6,748,350.

(51) Int. Cl.
*H01L 23/34* (2006.01)

(52) U.S. Cl. .............. 257/713; 257/E23.102

(58) Field of Classification Search ........ 257/707, 257/706
See application file for complete search history.

(56) References Cited

U.S. PATENT DOCUMENTS

| | | | |
|---|---|---|---|
| 4,683,750 A | 8/1987 | Kino et al. | 73/606 |
| 5,367,196 A | 11/1994 | Mahulikar et al. | 257/787 |
| 5,402,006 A | 3/1995 | O'Donley | 257/796 |
| 5,591,034 A | 1/1997 | Ameen et al. | 439/91 |
| 5,749,988 A | 5/1998 | Leibovitz et al. | 156/94 |
| 5,834,339 A | 11/1998 | Distefano et al. | 438/125 |
| 5,847,929 A | 12/1998 | Bernier et al. | 361/719 |
| 5,903,436 A * | 5/1999 | Brownell et al. | 361/704 |
| 6,002,171 A | 12/1999 | Desai et al. | 257/707 |
| 6,091,603 A | 7/2000 | Daves et al. | 361/704 |
| 6,117,695 A | 9/2000 | Murphy et al. | 438/15 |
| 6,169,328 B1 | 1/2001 | Mitchell | 257/778 |
| 6,188,582 B1 | 2/2001 | Peter | 361/760 |
| 6,238,086 B1 | 5/2001 | Mikubo et al. | 374/43 |
| 6,288,900 B1 | 9/2001 | Johnson et al. | 361/705 |
| 6,333,551 B1 * | 12/2001 | Caletka et al. | 257/707 |
| 6,396,700 B1 | 5/2002 | Chu et al. | 361/705 |

OTHER PUBLICATIONS

"U.S. Appl. No. 09/963,438 Final Office Action mailed May 5, 2003", 34 pgs.
"U.S. Appl. No. 09/963,438 Non-Final Office Action mailed Sep. 13, 2002", 14 pgs.

(Continued)

*Primary Examiner*—Leonardo Andujar
*Assistant Examiner*—Krista Soderholm
(74) *Attorney, Agent, or Firm*—Schwegman, Lundberg & Woessner, P.A.

(57) ABSTRACT

A device and method identify and compensate for tensile stress due to heat-caused expansion and contraction between an integrated heat spreader and thermal interface material. This device and method change the shape of the integrated heat spreader based upon the identification of the location of the highest tensile and/or shear stress so that additional thermal interface material is deposited between the integrated heat spreader and a die. Utilizing this method and device, heat is efficiently transferred from the die to the integrated heat spreader.

15 Claims, 5 Drawing Sheets

OTHER PUBLICATIONS

"U.S. Appl. No. 09/963,438 Notice of Allowance mailed Dec. 23, 2003", 5 pgs.

"U.S. Appl. No. 09/963,438 Response filed Jul. 17, 2003 in response to Final Office Action mailed May 5, 2003", 22 pgs.

"U.S. Appl. No. 09/963,438 Response filed Oct. 6, 2003 in response to Final Office Action mailed May 5, 2003", 24 pgs.

"U.S. Appl. No. 09/963,438 Response filed Dec. 13, 2002 in response to Non-Final Office Action mailed Sep. 13, 2002", 16 pgs.

"Flomerics Introduces FLOPACK for the Thermal Modeling of Electronic Packages", www.flomerics.com/news/news_details.jsp?id=43, printed Aug. 16, 2002,(Oct. 1998),4 pages.

Bosak, Henry C., "A 3-D, Conjugate Thermal Analysis of Microprocessors", *FLOTHERM International User Conference*, (May 1993),pp. 1-9.

Burdick, J. S., "Electronic Cooling at IBM Endicott", IBM Information and Technical Communications Department, Endicott, NY 13760,(Aug. 1991),1-20.

Cheng, Yi-Kan, et al., "iCET: A Complete Chip-Level Thermal Reliability Diagnosis Tool for CMOS VLSI Chips", *ACM, Inc. 33rd Design Automation Conference*, (1996),4 pages.

Haque, Ashium, "Processing and Characterization of Device Solder Interconnection and Module Attach for Power Electronics Modules", *PhD Dissertation, Virginia Polytechnic Institute and State University*, Chapter 4,(Dec. 1999),pp. 71-108.

Jeakins, William D., "Thermal Analysis of a Ceramic Microelectronics Package Using Flotherm", *FLOTHERM International User Conference Presentations*, (May 1993),12 pages.

Kromann, Gary B., "Thermal Modeling and Experimental Characterization of the C4/Surface-Mount-Array Interconnect Technologies", *IEEE Transactions on Components, Packaging, and Manufacturing Technology*, Part A, vol. 18, No. 1,(Mar. 1995),pp. 87-93.

Mansingh, Vivek, et al., "Thermal Analysis of a Pin Grid Array Package", Flomerics, Ltd.,11 pages.

Rosten, Harvey, et al., "DELPHI: The Development of Libraries of Physical Models of Electronic Components for an Integrated Design Environment", Flomerics Limited,21 pages.

Rosten, Harvey, et al., "Final Report to SEMITHERM XIII on the European-Funded Project DELPHI—the Development of Libraries and Physical Models for an Integrated Design Environment", Flomerics Limited,18 pages.

Valenta, Pavel, "Thermal Modeling of Ball Grid Arrays", *Flotherm Technical Papers*, www.flotherm.com/technical_papers/t169/t169.jsp, printed Aug. 16, 2002,14 pages.

"Definition of concave—Merriam-Webster Online Dictionary", http://mw1.merriam-webster.com/dictionary/concave, 1 pg. Jun. 6, 2007.

* cited by examiner

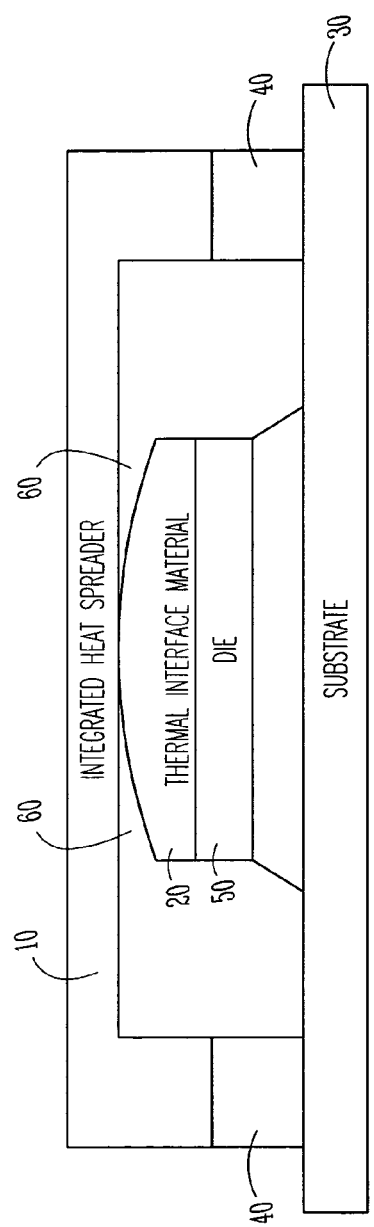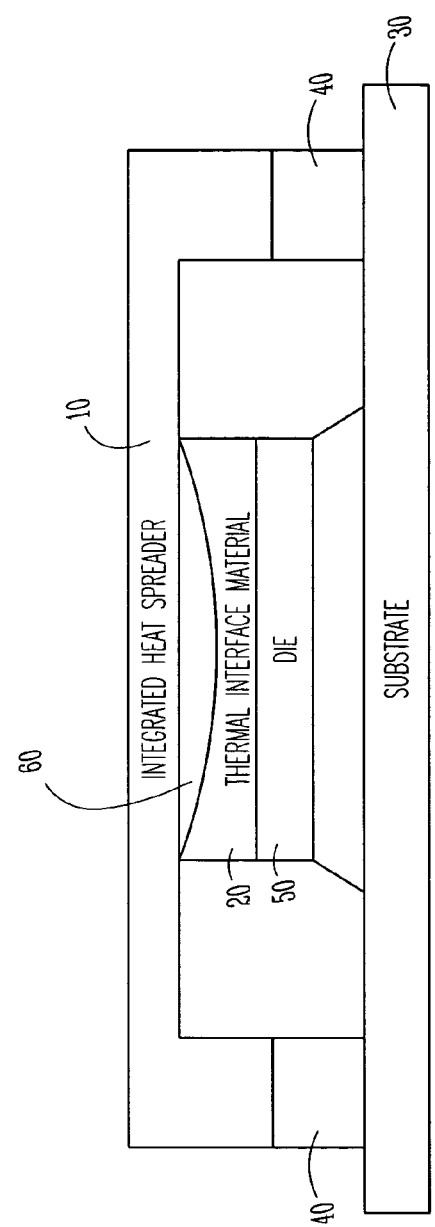
Fig. 3 (Prior Art)
Fig. 4 (Prior Art)

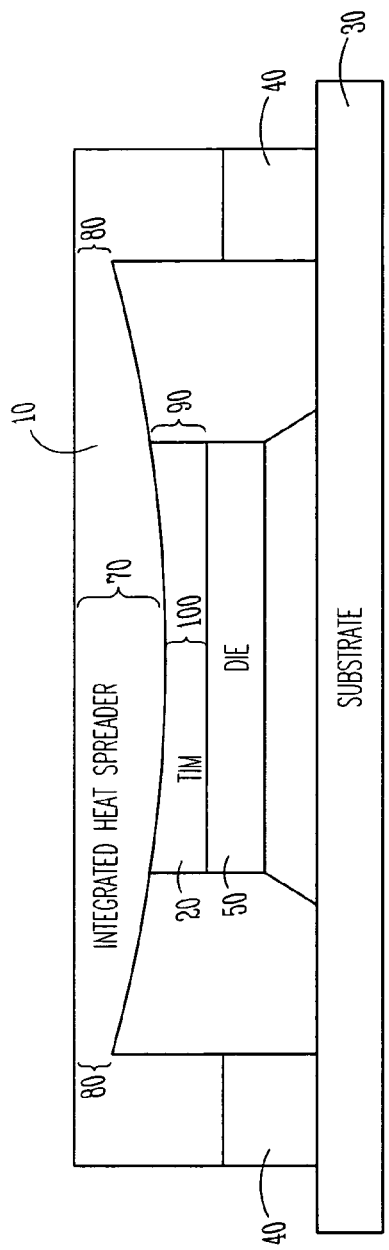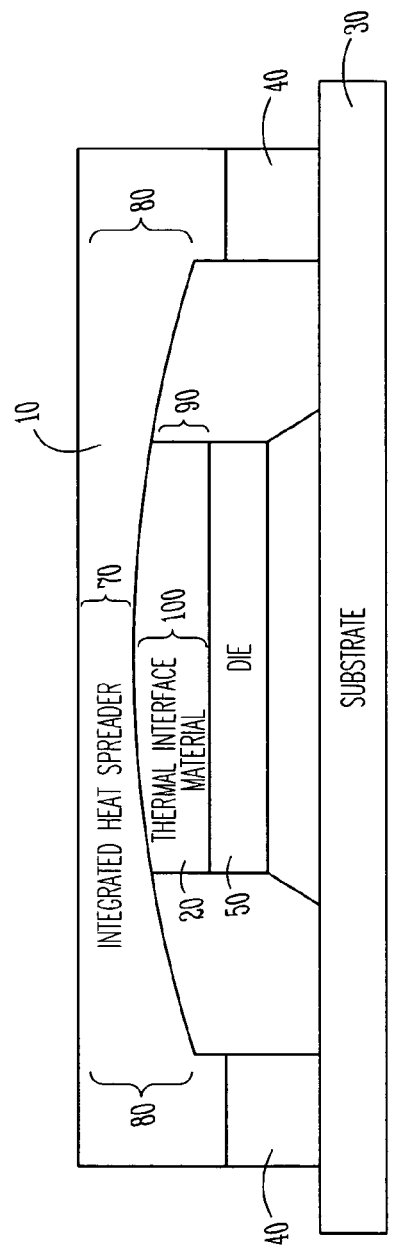

APPARATUS TO COMPENSATE FOR STRESS BETWEEN HEAT SPREADER AND THERMAL INTERFACE MATERIAL

DIVISIONAL APPLICATION

The present application is a divisional of application U.S. Ser. No. 09/963,438, filed on Sep. 27, 2001, now issued as U.S. Pat. No. 6,748,350, which is incorporated herein by reference.

TECHNICAL FIELD

The inventive subject matter relates to a device and method to control strain and tensile stress on thermal interface material in a heat spreader. More particularly, the inventive subject matter pertains to a device and method that determine stress points in thermal interface material used to transfer heat from a die to a heat spreader and design the heat spreader to optimize the thickness of the thermal interface material for those stress points.

BACKGROUND INFORMATION

In the rapid development of computers many advancements have been seen in the areas of processor speed, throughput, communications, fault tolerance and size of individual components. Today's microprocessors, memory and other chips have become faster and smaller. However, with the increase in speed, reduction in the size of components, and increased density of circuitry found within a given chip/die, heat generation and dissipation have become more critical factors than ever.

FIG. 1 illustrates a die 50 placed on a substrate 30 with a finite amount of a thermal interface material (TIM) 20 placed on top of the die 50. This TIM 20 serves at least two primary purposes. First, it acts to conduct heat from the die to the integrated heat spreader (IHS) 10. Second, it may also provide some adhesion between the IHS 10 and die 50. The TIM 20 may be composed of, but not be limited to, solder, a polymer containing metal, or some other substances which both act to transfer heat and provide some adhesion. During the manufacturing process the IHS 10 is pressed down upon the TIM 20 and adhesive 40, resulting in a structure as shown in FIG. 2.

As shown in FIG. 2, the IHS 10 would absorb heat from die 50 through TIM 20 and be held in place on the substrate 30 via adhesive 40. On top of the IHS 10 a heat sink (not shown) or fan/heat sink combination (not shown) would be mounted to dissipate the heat absorbed by the IHS 10. However, since IHS 10 and TIM 20 both experience significant tensile stress during the assembly process and due to thermal expansion and contraction when the die is powered on and off, as shown in FIG. 3, air gaps 60 form between the TIM 20 and IHS 10. As indicated in FIG. 3, these air gaps 60 may form at the outer edges of the TIM 20 while the center portion of the TIM 20 remains in contact with the IHS 10.

However, as shown in FIGS. 3 and 4, an air gap 60 may occur anywhere in the contact area between TIM 20 and IHS 10. As illustrated in FIG. 4, an air gap 60 may form in the center of the contact area between the TIM 20 and IHS 10, while the outer edges of the TIM 20 remain in contact with the IHS 10.

As would be appreciated by one of ordinary skill in the art, these air gaps 60 shown in FIGS. 3 and 4 may form anywhere in the contact area between the TIM 20 and IHS 10 depending on the materials utilized in the IHS 10 and TIM 20 as well as the handling procedures for the IHS 10 during the manufacturing process. Further, these air gaps 60 may also form in the TIM 20 itself. It should be noted that FIGS. 3 and 4, except for the inclusion of air gaps 60, remain unchanged from that shown in FIG. 2 and will not be discussed in further detail.

Since separation may occur between the TIM 20 and IHS 10, forming air gaps 60, as shown in FIGS. 3 and 4, due to thermal expansion and contraction, these air gaps 60 act as insulation, preventing heat being transferred from the die 50 to the IHS 10. As heat builds up in the die 50 to higher levels, the life expectancy of the die 50 is reduced.

Therefore, what are needed are a device and method that can determine the stress points between the TIM 20 and IHS 10 due to thermal expansion and contraction. Further, what are needed are a device and method that may compensate for the tensile and shear stress, thereby preventing the separation of the TIM 20 and the IHS 10. Still further, what are needed are a device and method that will provide for efficient heat transfer from the die 50 to the IHS 10.

BRIEF DESCRIPTION OF THE DRAWINGS

The foregoing and a better understanding of the inventive subject matter will become apparent from the following detailed description of exemplary embodiments and the claims when read in connection with the accompanying drawings, all forming a part of the disclosure of this inventive subject matter. While the foregoing and following written and illustrated disclosure focus on disclosing example embodiments of the invention, it should be clearly understood that the same is by way of illustration and example only and the invention is not limited thereto. Such embodiments of the inventive subject matter may be referred to, individually and/or collectively, herein by the term "invention" merely for convenience and without intending to voluntarily limit the scope of this application to any single invention or inventive concept if more than one is in fact disclosed. The spirit and scope of embodiments of the present invention are limited only by the terms of the appended claims.

The following represent brief descriptions of the drawings, wherein:

FIG. 3 is an example of an assembled IHS and die with a TIM that has separated from the IHS to form air gaps;

FIG. 4 is an example of an assembled IHS and die with a TIM that has separated from the IHS to form an air gap;

FIG. 5 is an assembled convex IHS in an example embodiment of the present invention;

FIG. 6 is an assembled concave IHS in an example embodiment of the present invention.

DETAILED DESCRIPTION

Figure 1:
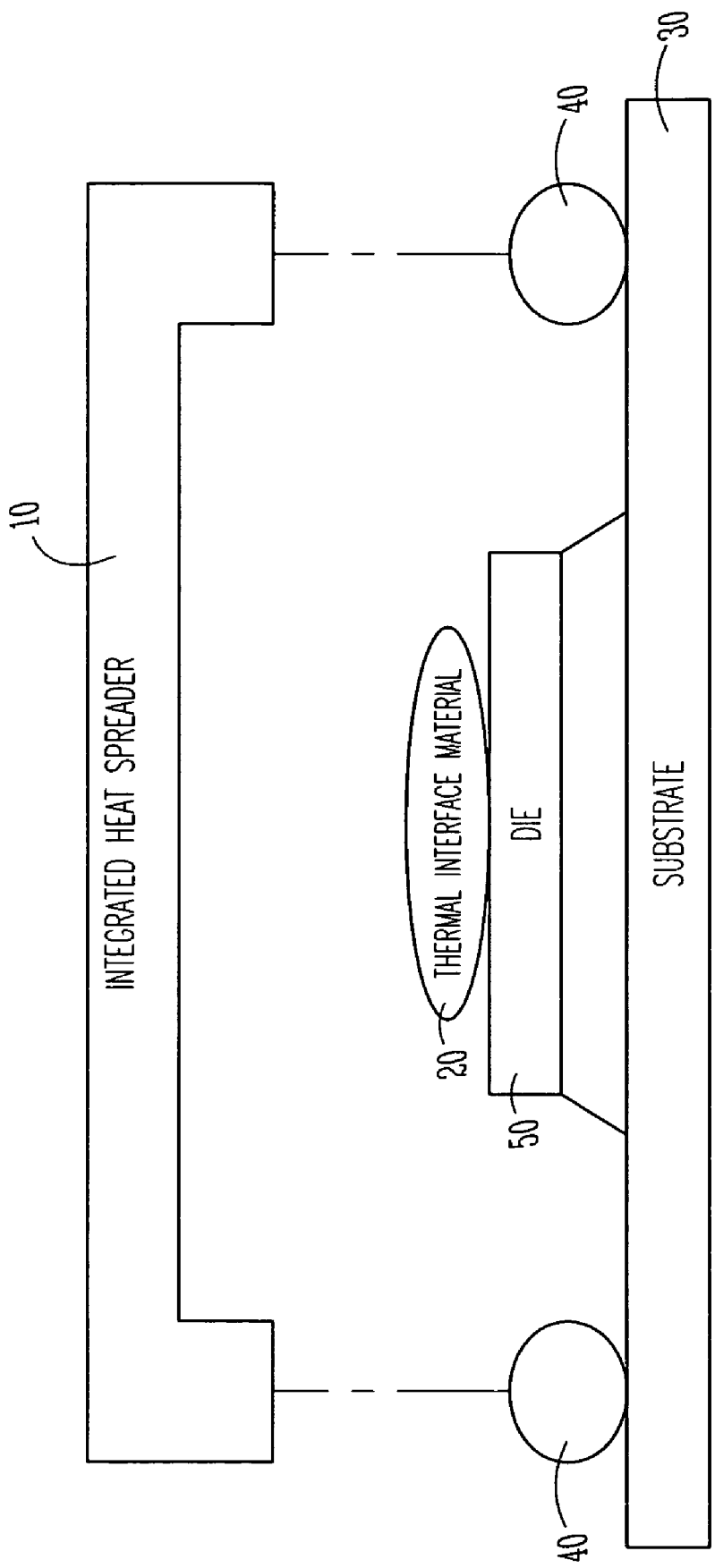
FIG. 1 is an example of an integrated heat spreader (IHS) being affixed to a die attached to a substrate.

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the figures for simplicity of illustration and discussion, and so as not to obscure the invention.

FIG. 5 is an assembled convex IHS 10 in an example embodiment of the present invention. It should be noted that FIGS. 5 and 6 are provided as merely example embodiments of the present invention. As previously discussed, with reference to FIGS. 3 and 4, depending on the material composition of the integrated heat spreader (IHS) 10 and the thermal interface material (TIM) 20, air gaps 60 may form anywhere in the interface between the TIM 20 and IHS 10 due to separation of TIM 20 from IHS 10 caused by thermal expansion and contraction. Further, as previously discussed, air gaps may also form in the TIM 20 itself.

Still referring to FIG. 5, it should be noted that IHS 10 has a convex shape in which the middle portion 70 of the IHS 10 is thicker/wider than the end portions 80 of the IHS 10. This convex shape of the IHS 10 is done in order to increase the thickness of the TIM 20 at both its respective ends 90 while allowing the middle section 100 to remain unchanged in thickness, so that the air gaps seen in FIG. 3 are less likely to materialize. This is due to the fact that as the thickness of the TIM 20 increases so does its elasticity, and therefore it can better withstand the thermal stresses causing detachment as shown in FIG. 3. This is particularly true in the case where the TIM 20 is made of a polymer-metal combination or where the TIM 20 comprises a solder composite material. However, as previously discussed, this particular embodiment of the present invention shown in FIG. 5 is specifically designed to alleviate the detachment problems as shown in FIG. 3 and is merely provided as an example embodiment of the present invention. Those features not discussed in reference to FIG. 5 remain unchanged from those in FIGS. 2 and 3.

FIG. 6 is an assembled concave IHS 10 in which the center portion 70 is thinner and the end portions 80 are thicker or remain unchanged in size in an example embodiment of the present invention. This concave shape of the IHS 10 is done in order to increase the thickness of the TIM 20 in its center portion 100 while maintaining both end portions 90 at near the same size, so that the air gap seen in FIG. 4 is less likely to materialize. This is due to the fact that as the thickness of the TIM 20 increases so does its elasticity, and therefore it can better withstand the thermal stresses causing detachment as shown in FIG. 4. This is particularly true in the case where the TIM 20 is made of a polymer-metal combination or where the TIM 20 comprises a solder composite material. However, as previously discussed, this particular embodiment of the present invention shown in FIG. 6 is specifically designed to alleviate the detachment problems as shown in FIG. 4 and is merely provided as an example embodiment of the present invention. Those features not discussed in reference to FIG. 6 remain unchanged from those in FIGS. 2 and 4.

Figure 2:
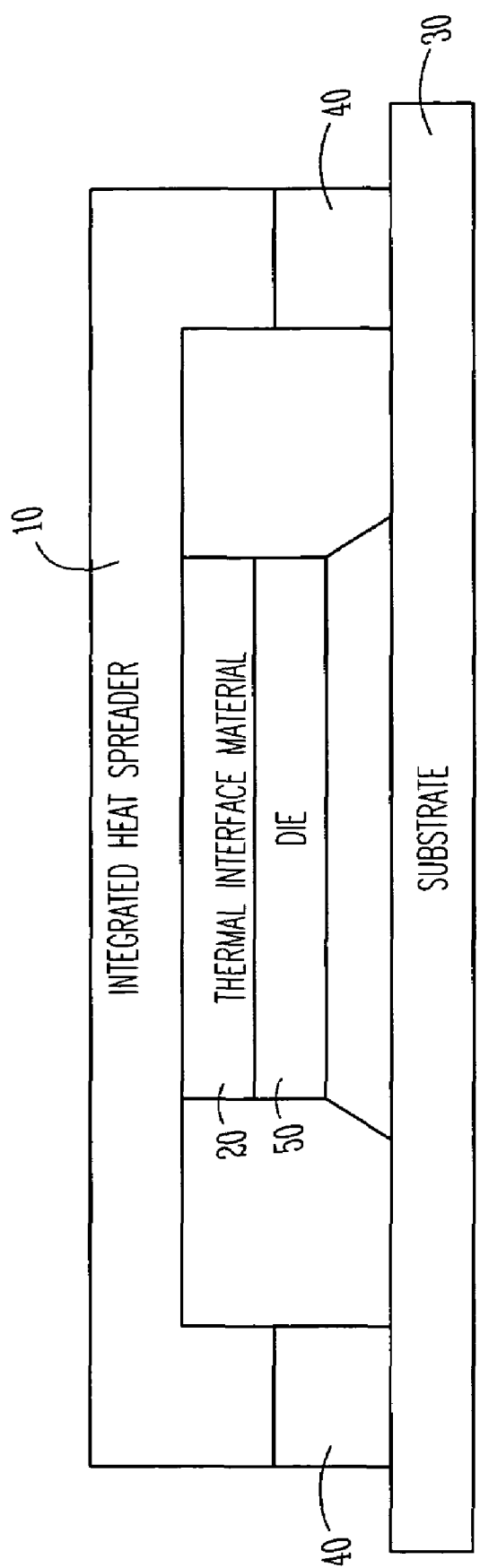
FIG. 2 is an example of an assembled integrated heat spreader (IHS) and die with a thermal interface material (TIM) to conduct heat from the die to the integrated heat spreader (IHS)
Figure 7:
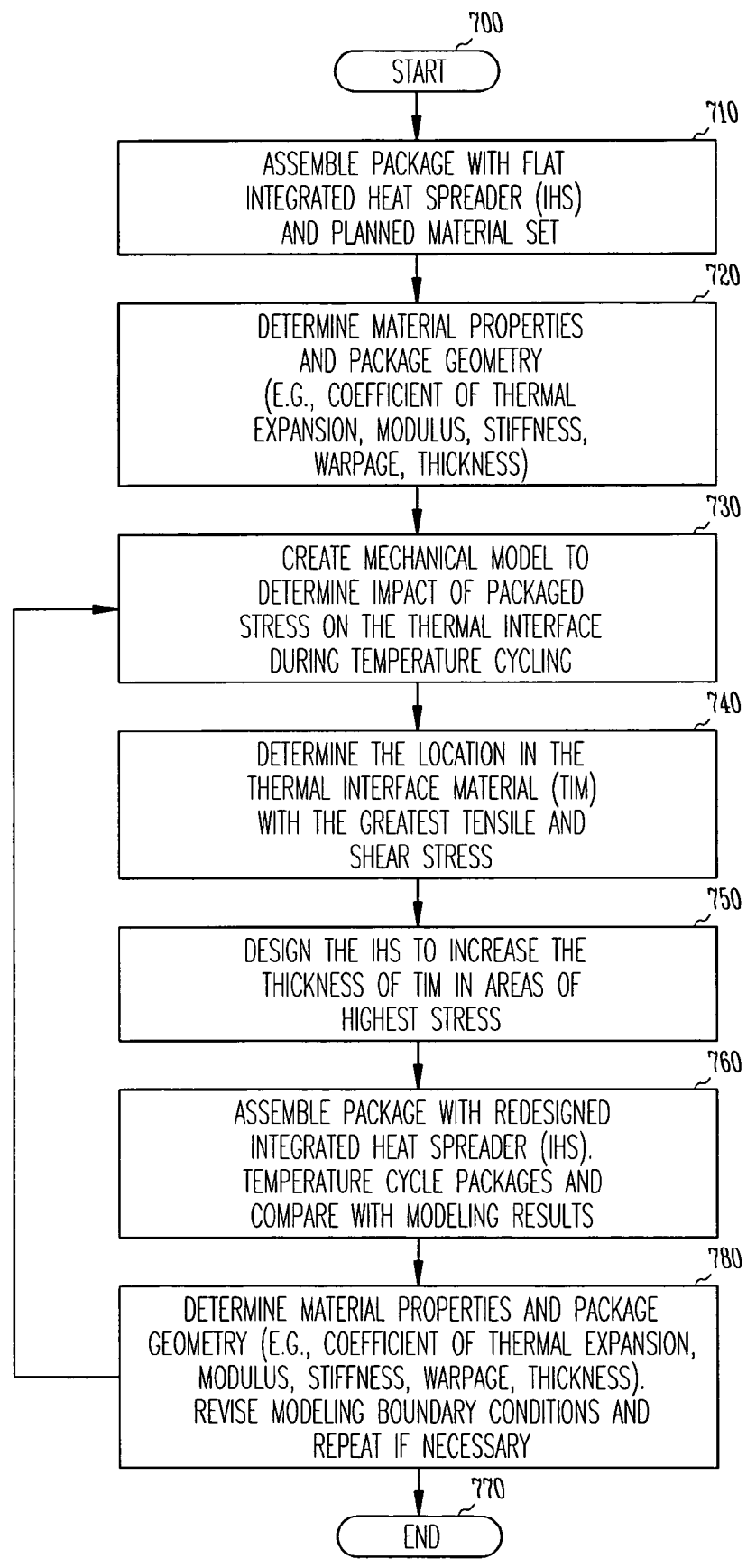
FIG. 7 is a flowchart of a process to determine the stress points in a TIM and modify the IHS to compensate for the stress points in an example embodiment of the present invention.

FIG. 7 is a flowchart of a process to determine the stress points in a TIM 20 and to modify the IHS 10 to compensate for the stress points in an example embodiment of the present invention. Processing begins in operation 700 and immediately proceeds to operation 710. In operation 710 the assembly package having a flat IHS 10 and using factory materials is assembled as shown in FIG. 2. In operation 720, the material properties and package geometry are determined. This would include determining such factors as coefficient of thermal expansion, modulus, stiffness, warpage, thickness, etc. Thereafter, in operation 730 a mechanical model is created to determine the impact of package stress on the thermal interface material (TIM) 20 during temperature cycling. This mechanical model would comprise building a statistically significant number of the packages and then cycling them through the temperature extremes that would be experienced during a normal lifetime of operation. Thereafter, in operation 740 the location in the TIM 20 that has the greatest tensile and shear stress applied thereto is determined. As would be appreciated by one of ordinary skill in the art, this may be determined in a number of ways. For example, cross-sections of the assembled die 50, substrate 30 and IHS 10 may be examined, photographed and the location of the amount of separation determined. In addition, as would be appreciated by one of ordinary skill in the art, acoustic and x-ray analysis may be used to determine the location of any separation or any air gaps that form in the TIM 20. In operation 750, the IHS 10 is redesigned to increase the thickness of the TIM 20 in the areas of high stress as evidenced by separation points discovered in operation 740. In operation 760 the package is assembled with the redesigned integrated heat spreader (IHS) 10, is manufactured in sufficient quantity to provide statistically significant data, and is then retested in temperature cycling while being compared with the modeled results. Thereafter, in operation 780 the material properties and package geometry of the IHS 10, TIM 20 and die 50 are determined. The material properties would include, but not be limited to, the coefficient of thermal expansion, modulus, stiffness, warpage, thickness, and etc. If the material properties are within predetermined desired limits, then processing proceeds to operation 770 where processing terminates. However, if the material properties are not within the required tolerances, then processing loops back to operation 730 and repeats operations 730 through 780 until the material properties fall within specified limits.

The benefit resulting from the present invention is that a simple, reliable, device and method are provided for identifying and compensating for stress points that develop between an IHS 10 and TIM 20 that cause air gaps 60 to form and prevent effective heat transfer from a die 50 to an IFS 10. This device and method compensate for tensile and shear stress due to heating-related expansion and contraction by placing larger quantities of the TIM 20 at those tensile stress points, thereby increasing the elasticity of the TIM 20 at those tensile stress points.

While we have shown and described only a few examples herein, it is understood that numerous changes and modifications as known to those skilled in the art could be made to the example embodiments of the present invention. Therefore, we do not wish to be limited to the details shown and described herein, but intend to cover all such changes and modifications as are encompassed by the scope of the appended claims.

What is claimed is:

1. A package comprising:
   a die having a surface;
   a thermal interface material contacting the surface of the die; and
   an integrated heat spreader having a concave surface contacting the thermal interface material;
   wherein the thermal interface material between the integrated heat spreader and the die is thicker in a center portion of the surface of the die.

2. The package recited in claim 1, wherein the thermal interface material is to conduct heat from the die to the integrated heat spreader.

3. The package recited in claim 1, wherein a center portion of an interface between the thermal interface material and the integrated heat spreader has greater tensile stress than elsewhere, resulting from heat-caused expansion and contraction between the integrated heat spreader and thermal interface material when the die is powered on and off.

4. The package recited in claim 1, wherein a center portion of an interface between the thermal interface material and the integrated heat spreader has greater shear stress than elsewhere, resulting from heat-caused expansion and contraction between the integrated heat spreader and thermal interface material when the die is powered on and off.

5. The package recited in claim 1, wherein the shape of the integrated heat spreader is based upon material properties and geometry including coefficient of thermal expansion, modulus, stiffness, warpage, and thickness of the integrated heat spreader and the thermal interface material.

6. The package recited in claim 1, wherein the thermal interface material comprises a polymer-metal combination.

7. The package recited in claim 1, wherein the thermal interface material comprises solder.

8. A package comprising:
a die having a surface;
a thermal interface material contacting the surface of the die; and
an integrated heat spreader having a concave surface contacting the thermal interface material;
wherein the thermal interface material between the integrated heat spreader and the die is thicker in a center portion of the surface of the die; and
wherein the shape of the integrated heat spreader is based upon material properties and geometry including coefficient of thermal expansion, modulus, stiffness, warpage, and thickness of the integrated heat spreader and the thermal interface material.

9. The package recited in claim 8, wherein the thermal interface material is to conduct heat from the die to the integrated heat spreader.

10. The package recited in claim 8, wherein a center portion of an interface between the thermal interface material and the integrated heat spreader has greater tensile stress than elsewhere, resulting from heat-caused expansion and contraction between the integrated heat spreader and thermal interface material when the die is powered on and off.

11. The package recited in claim 8, wherein a center portion of an interface between the thermal interface material and the integrated heat spreader has greater shear stress than elsewhere, resulting from heat-caused expansion and contraction between the integrated heat spreader and thermal interface material when the die is powered on and off.

12. The package recited in claim 8, wherein the thermal interface material comprises a polymer-metal combination.

13. The package recited in claim 8, wherein the thermal interface material comprises solder.

14. A computer comprising a package including:
a die having a surface;
a thermal interface material contacting the surface of the die; and
an integrated heat spreader having a concave surface contacting the thermal interface material;
wherein the thermal interface material between the integrated heat spreader and the die is thicker in a center portion of the surface of the die.

15. The computer recited in claim 14, wherein a center portion of an interface between the thermal interface material and the integrated heat spreader has greater tensile stress than elsewhere, resulting from heat-caused expansion and contraction between the integrated heat spreader and thermal interface material when the die is powered on and off.

* * * * *